United States Patent [19]

Ruckert et al.

[11] 4,093,464
[45] June 6, 1978

[54] LIGHT SENSITIVE O-QUINONE DIAZIDE CONTAINING TRANSFER COMPOSITION

[75] Inventors: Hans Ruckert, Naurod; Barbara Wildenhain, Wiesbaden-Sonnenberg, both of Germany

[73] Assignee: Hoechst Aktiengesellschaft, Germany

[21] Appl. No.: 382,864

[22] Filed: Jul. 26, 1973

[30] Foreign Application Priority Data

Jul. 27, 1972 Germany .......................... 2236941

[51] Int. Cl.² .......................... G03C 1/54; G03C 1/60
[52] U.S. Cl. ............................ 96/91 D; 96/28; 96/30; 96/36; 96/36.2; 96/36.3; 96/36.4; 96/75; 96/86 P
[58] Field of Search .............. 96/75, 91 D, 86 P, 35.1, 96/115 R, 28, 83, 30, 36, 36.2, 36.3, 36.4

[56] References Cited

U.S. PATENT DOCUMENTS

| 3,474,719 | 10/1969 | Levinos | 96/91 D |
|---|---|---|---|
| 3,502,470 | 3/1970 | Delzenne | 96/91 D |
| 3,544,317 | 12/1970 | Yonezowa | 96/91 D |
| 3,551,154 | 12/1970 | DiBlas et al. | 96/91 D |
| 3,634,082 | 1/1972 | Christensen | 96/91 D |
| 3,637,384 | 1/1972 | Deutsch et al. | 96/91 D |
| 3,649,283 | 3/1972 | Christensen et al. | 96/85 |
| 3,660,097 | 5/1972 | Mainthia | 96/91 D |
| 3,721,557 | 3/1973 | Inoue | 96/91 D |
| 3,764,318 | 10/1973 | Laridon | 96/91 D |
| 3,782,939 | 1/1974 | Bonham et al. | 96/91 D |

FOREIGN PATENT DOCUMENTS 1,267,005   3/1972   United Kingdom ................ 96/91 D Primary Examiner—Charles L. Bowers, Jr.
Attorney, Agent, or Firm—James E. Bryan

[57] ABSTRACT

A light-sensitive layer transfer material and such layer disposed on a carrier, for use in screen-printing stencils, printed circuit boards, integrated circuits, intaglio printing plates, relief printing plates, proof prints and the like, which comprises an alkali-soluble phenolic resin, such as phenol-formaldehyde novolacs, an ester or an amide of an o-naphthoquinone-diazide sulphonic acid, such as the p-cumyl phenyl ester of 1,2-naphthoquinone-2-diazide-4-sulphonic acid, etc., and an acrylic resin, such as a polymer of an alkyl ester of acrylic acid or methacrylic acid.

2 Claims, No Drawings

LIGHT SENSITIVE O-QUINONE DIAZIDE CONTAINING TRANSFER COMPOSITION

This invention relates to a light-sensitive layer transfer material, especially for the transfer of photo-resist layers in the dry state.

Such layer transfer materials have been disclosed, for example in German Auslegeschrift No. 1,522,515. The copying layers described therein are photo-crosslinkable or photo-polymerizable, are thus negative-working and, because of their normal content of thermoplastic polymeric substances, are particularly suitable for dry transfer of the copying layer onto the ultimate carrier while applying pressure and heat.

In many cases, it would also be desirable to be able to transfer, in the same manner, positive-working copying layers. Materials and layer transfer processes which give positive transfer images are also known. However, these materials and processes have certain disadvantages. For example, in a known process, positive transfer images or transfer masks are produced, by means of a negative-working layer, by curing the layer imagewise and separating the carrier film and covering film in such a way that the cured parts of the layer adhere to one film and the uncured parts of the layer adhere to the other film. Each of these can then be transferred to a different base.

German Offenlegungsschrift No. 2,028,903 describes a positive-working layer transfer material which consists of a polymer with lateral hydroxyl groups, some of which are substituted with o-quinone diazide groups. The manufacturing reproducibility of such high molecular weight light-sensitive substances is difficult and involved.

However, German Offenlegungsschrift No. 2,046,115 describes a similar material which contains low molecular weight quinone diazides. This material additionally contains intermediate layers and, optionally, adhesive layers in order to permit perfect application of the photoresist layer to the base which is to be processed and perfect removal of the intermediate carrier.

A similar material is described in German Offenlegungsschrift No. 2,106,574.

All of these positive-working materials are of a more complicated make-up than negative-working materials, suitable for the same purpose, and/or require additional treatment steps.

It is an object of the present invention to provide a layer transfer material, especially of photoresist layers, of simple make-up, which is positive-working and couples the known advantages of positive-working layers with good transferability and adhesion to the ultimate base.

According to the present invention, a light-sensitive layer transfer material is provided which comprises a carrier and, disposed on the carrier, a light-sensitive layer containing an alkali-soluble phenolic resin, an ester or an amide of an o-naphthoquinone-diazide-sulphonic acid and an acrylic resin.

o-Naphthoquinone-diazide-sulphonic acid esters and amides, which may be used, are known as constituents of positive-working copying layers and some are described, for example, in German Patent Specifications Nos. 854,890; 865;109; 900,172; 907,738; 938,233 and 1,195,166, German Auslegeschrift 1,543,721 and German Offenlegungsschrift No. 2,047,816.

As alkali-soluble phenolic resins may be especially mentioned, for example, the phenol-formaldehyde novolacs, the use of which in positive-working copying layers is also described in the above-mentioned publications.

The carrier of the layer transfer material should be of such a nature that, after dry transfer of the layer onto the ultimate base which is to be processed, the carrier can easily be pulled off the layer without damaging the latter. It may be transparent or opaque. Suitable carrier materials are described, for example, in German Auslegeschrift No. 1,522,515. Above all, plastic films, especially polyester films or polyolefin films, the surface of which may optionally be pre-treated, are used as carriers in the materials of the invention.

The cover sheet, preferably used to protect the light-sensitive layer may also be a plastic film, as described in more detail in previously-mentioned German Auslegeschrift No. 1,522,515. The cover sheet should have less adhesion to the copying layer than has the carrier.

As acrylic resins may be especially mentioned, for example, homopolymers and copolymers of derivatives of acrylic acid and methacrylic acid, especially of their esters. Preferably, the alcohol component of the ester is formed from lower aliphatic alochols having from about 1 to 6 carbon atoms. Layers which contain a polyvinyl ether, in addition to the acrylic resin, lend themselves particularly well to transfer and to processing.

In addition to, or instead of, a polyvinyl ether, copolymers with units which contain acid groups, especially carboxyl groups, may be added to the layer. Preferred representatives thereof are copolymers of alkyl esters of acrylic acid or methacrylic acid with the corresponding free acids or copolymers of vinyl acetate with unsaturated carboxylic acids, for example, crotonic acid.

The layers of the material of the invention are distinguished by the fact that they do not exhibit the brittleness exhibited by hitherto proposed positive-working lacquer layers but are supple. Nevertheless, they can be cleanly and reliably developed in an aqueous alkaline medium and can be transferred, in layer thicknesses of from about 4 to 60$\mu$, with roller laminating instruments customarily used for negative dry resists. Further, neither an adhesion promoter for the receiving surface nor a release layer or intermediate layer for the carrier are required. Preferably, the layer is not exposed through the carrier film but is exposed after the latter has been pulled off, preferably after a short additional post-drying, without the original remaining adherent to the layer after exposure to UV light, for example using a metal-halogen lamp. Layer thicknesses of up to 60$\mu$ and above may be achieved by repeated superposed lamination. Furthermore, this process is more reliable for obtaining greater layer thicknesses, for example 30$\mu$ from 2 layers each having a thickness of 15$\mu$, than the use of one dry resist layer having a thickness of 30$\mu$, and is less likely to suffer from dust contamination. Numerous layer thicknesses can easily be produced by superposed lamination using only 2 layers, for example of 7.5 and 20$\mu$ in thickness.

A further advantage of the copying layers of the materials of the invention is that they can also be developed cleanly and reliably on the carrier film and can then be laminated, as a finished image, onto the receiving carrier. In this way, it is also possible, for example, to laminate a set of colors onto printing paper by using layers of different colors, and thus obtain a substitute for a proof print. Using the material and process of the invention, it is also possible to laminate exposed, but undeveloped, positive-working dry resist layers on top of one another and then develop this multi-layer resist image-wise to give a relief image having steps of different depth. This possibility, which generally cannot be carried out with negative-working layers, can be demonstrated visually by different coloring of the individual layers. Since the image is already visible after exposure, lamination in accurate register is possible.

The polyvinyl alkyl ethers and the methacrylates, and, preferably, the acrylates used, impart adhesive and plasticizing properties to the layer and permit perfect transfer from the carrier onto the receiving material. Without the acrylates or methacrylates, the developing properties, especially the resistance to developer, are unsatisfactory. On the other hand, if polyvinyl alkyl ethers are completely absent, developing is slower and cannot, in general, be carried out without mechanical assistance. Up to a certain degree, the polyvinyl ethers may be replaced by the acid copolymers mentioned, especially acid acrylate copolymers. Further, the addition of polyvinyl-pyrrolidone resins can be of advantage.

Relative to the total solids content of the layer, the latter preferably contains from about 12 to about 30% of diazo compound and from about 25 to about 40% of novolac and, the most favorable amounts of the other resins are, from about 5 to about 30% of the acrylic resin and from 5 to about 35% of polyvinyl alkyl ether. The most favorable proportions of the acid copolymers are from about 5 to about 15%. The amounts added in practice largely depend, within these general ranges, on the nature of the individual polymers. For specific polyvinyl alkyl ethers the limits are, for example, in the case of most layer combinations, from 0 to about 20% of polyvinyl methyl ether (for example Lutanol M 40 ), from 0 to about 30% of polyvinyl ethyl ether of low viscosity (for example Lutanol A 25), from 0 to about 10% of polyvinyl ethyl ether of high viscosity (for example Lutanol A 50), from 0 to about 15% of polyvinyl isobutyl ether (for example Lutanol J 30) and from 0 to about 10% of polyvinyl isobutyl ether of higher viscosity (for example Lutanol J 60).

The following ranges for certain acrylate resins are given in relation to the solids content of these commercially available products. The best results are achieved with from about 5 to about 30% of polyethyl acrylate of low viscosity (for example Plexisol B 574) and from about 5 to about 10% of polyethyl acrylate of high viscosity (for example Plexisol B 372). Alternatively, it is possible to use, though with somewhat less effect, from about 5 to about 10% of polybutyl acrylate (for example Plexisol D 592), from about 8 to about 15% of polybutyl methacrylate (for example Plexisol P 550), or from about 5 to about 8% of a copolymer of butyl methacrylate and methyl methacrylate (for example Plexisol PM 709).

The manufacture and processing of the material of the invention may be carried out in the manner customary for dry resist materials. For example, the constituents of the light-sensitive layer are dissolved in a suitable solvent and the solution is spread on the, optionally pretreated, carrier film and is dried. The covering film, where appropriate, is then laminated onto the free side of the copying layer utilizing slight pressure. The material is then rolled up and stored in this form.

The following describes one method of processing: A suitable piece of the layer transfer material is cut off a roll, is freed of the covering film, and is applied, under pessure and heat, to the base which is to be treated, in most cases etched. The removal of the covering film and the application to the base may be carried out with a commercially available laminating instrument, having rollers which can be heated or a heated base plate. The exposure and development are then carried out as described above. The surface provided with the resist image can be etched or electroplated in the usual manner.

The material of the invention may be used, in particular, for the manufacture of printed circuits, by the known subtractive or additive processes by etching and/or electroplating, for the manufacture of integrated circuits, for the manufacture of intaglio or relief printing plates, for the etching of moldings or as a proof print substitute in multi-color proof printing.

The materials of the invention may also be used, for example, for the manufacture of screen printing stencils. Thus, for the first time, a negative-working, pre-coated screen printing material is obtainable. It is possible to laminate the layer onto the stencil carrier and then clamp it in the screen printing frame or to place the layer transfer material on the fabric clamped in the frame and press it onto the fabric under pressure and heat. In both cases, the elastic layer adheres sufficiently on or, in part, in the structured surface of the fabric. The layer laminated to the stencil carrier may be exposed, either after or before removing the carrier film, exposure in the latter case being through the carrier film.

The following Examples illustrate the invention. All percentages given are percentages by weight and, where the composition of the layers is given, are based on the solid material.

EXAMPLE 1

A 25µ thick, biaxially stretched and heat-set polyethylene terephthalate film is dipped into an aqueous solution which contains 10% of trichloroacetic acid, 1% of polyvinyl alcohol and 0.1% of a wetting agent and is then dried for 2 minutes at 140° C.

A light-sensitive layer is applied to the pre-treated film by spreading on the film a solution of the components in ethylene glycol monoethyl ether and drying. The dry layer is 10µ thick and has the following composition:
  30% of cresol-formaldehyde novolac,
  22% of the p-cumylphenyl ester of 1,2-naphthoquinone-2-diazide-4-sulphonic acid,
  8% of polyethyl acrylate of low viscosity (Plexisol B 574, Rohm & Haas),
  8% of polybutyl methacrylate (Plexisol P 550),
  13% of polyvinyl methyl ether (Lutanol M 40, BASF),
  13% of polyvinyl ethyl ether of low viscosity (Lutonal A 25) and
  6% of the pigment dyestuff Imperon Yellow KG.

A 25µ thick polyethylene film is laminated onto the dried layer as a covering or protective film and the resulting layer structure is rolled up.

A piece of the material is exposed for 3 minutes to a 5 KW metal-halogen lamp under a positive original and through the carrier film. The protective film is then pulled off and the layer is developed, in about 1 minute, by dipping and gentle wiping, using 15% strength aqueous trisodium phosphate solution, and is thereafter rinsed with water and dried. A yellow mirror-image of the original is obtained. The developed image is transferred onto printing paper by pressing the same together at about 120°–130° C, using a commercially available roller laminating instrument with a throughput speed of about 30 cm per minute. Thereafter, the carrier film is pulled off and the yellow image, which is properly oriented, adheres firmly to the paper.

Thereafter, a blue and then a red color separation image is transferred, in the same way, onto the yellow color separation image, in accurate register. The same procedure as for the yellow image is followed but the yellow dyestuff in the layer is replaced by half its amount by weight of Imperon Blue KB or two thirds of its amount by weight of Imperon Red KB. The last carrier film can be left, so as to protect the trichromatic image. In order to achieve a result with more accurate tonal values, the layer thicknesses and pigment concentrations can be balanced even more finely and the separations can be post-exposed, without an original, after having been transferred.

EXAMPLE 2

Layers of the following composition are applied onto the same carrier from methyl ethyl ketone, as in Example 1:
  30.8% of novolac,
  7.7% of a vinyl acetate-crotonic acid copolymer (molecular weight about 100,000, acid number up to about 35),
  20.5% of an ester mixture of 2, 3, 4-trihydroxybenzophenone and 1,2-naphthoquinone-2-diazide-5-sulphonic acid,
  15.4% of Plexisol B 574 (see Example 1) and
  25.6% of Lutanol A 25 (see Example 1).

Covering films are applied to the dried layers as in Example 1. In various experiments, good results are obtained with regard to copying and transfer onto cleaned copper plates for the production of printed circuits, with layer weights of 8–40 g/m$^2$. For this purpose, after pulling off the polyethylene covering film, the layer is laminated onto the workpiece at 120°–130° C, the carrier film is pulled off and the material is post-dried for approximately 10 minutes at 100° C, and finally the workpiece is exposed and developed with 20% strength trisodium phosphate solution, in a dish or in a spraying apparatus, by spraying under 2 – 6 atmospheres gauge. The layer has outstanding suitability for use as a resist for etching processes, for example for etching away the exposed copper with ferric chloride solution, and for use as an electroplating resist. In the case of a copy with a 40μ thick layer, the exposed parts of the image can be thickened, while preserving straight walls, by electroplating with metal, for example copper or lead/tin alloy, and the metal layer can then be electroplated with nickel and be gilded. The resist can then be removed by means of solvents, for example acetone, or by post-exposure, without an original, and treatment with a developer, and the exposed base copper can be etched away. For copper electroplating it is possible to use an acid "fine grain copper plastic bath MS" or an alkaline copper pyrophosphate bath, while for nickel plating the "Norma" nickel bath can be used, all these being according to Messrs. Schlotter, Geislinger/Steige; and for gilding, the "Antronex N" gilding bath of Messrs. Blasberg, Solingen can be used.

This positive dry resist is also quite suitable for the manufacture of circuits with contacts passing through the material, since, on lamination, the bore holes are covered and the unexposed self-supporting layer withstands development and also etching and electroplating processes.

EXAMPLE 3

An approximately 15μ thick layer of the following composition is applied to a 12μ thick polyester film which has been pre-treated analogously to Example 1:
  30.8% of novolac,
  20.5% of diazo compound as in Example 2,
  5.1% of Plexisol B 574 (see Example 1),
  5.1% of polyethyl acrylate of high viscosity (Plexisol 372),
  12.8% of polyvinyl methyl ether and
  25.6% of Lutanol A 25 (see Example 1).

The layer can also be colored, for example with 0.3% of Crystal Violet. Layer thicknesses of 15μ and multiples of 15μ can be built up from a single positive dry resist by laminating this layer once, twice or three times onto a similar layer after pulling off the preceding carrier film. The exposure time increases, as a first approximation, proportionately to the layer thickness. Preferably, before exposure, the layer is briefly post-dried so that the original does not adhere to the layer, which shows a slight pressure-sensitive adhesive action. Development is carried out with the following aqueous-alkaline developer (pH approx. 11):
  7.5 g of $Na_3PO_4 . 12 H_2O$,
  3.5 g of sodium metasilicate,
  2.0 g of $NaH_2PO_4 . H_2O$,
  1.0 g of sodium hexametaphosphate,
  1.0 g of water-soluble methylcellulose and
  985.0 g of distilled water
and etching or electroplating is carried out in accordance with procedures which depend on the layer thickness and the workpiece involved.

EXAMPLE 4

A 40μ thick layer of the following composition is applied to a 25μ thick polypropylene film, acting as the carrier film, from methyl ethyl ketone:
  30.8% of novolac,
  7.7% of a vinyl acetate copolymer as in Example 2,
  20.5% of the diazo compound used in Example 2,
  5.1% of Plexisol B 574 (see Example 1),
  5.1% of Plexisol PM 709 (copolymer of butyl methacrylate and methyl methacrylate),
  5.1% of polyvinyl methyl ether and
  25.6% of Lutanol A 25 (see Example 1).

25μ thick polyethylene is used as the cover film. A conductor plate is produced in the usual manner by pulling off the cover film, laminating to a copper/insulant carrier, pulling off the carrier film, postdrying, exposing, developing with 14% strength trisodium phosphate solution and etching. Addition of solvent, for example up to approximately 5% of n-butanol, to the developer accelerates the developing process, especially in the case of relatively thick resist layers.

EXAMPLE 5

The following 8μ thick layer is applied to a 50μ thick polyester film, which has been pre-treated as in Example 1, from glycol monoethyl ether:
  30% of novolac,
  7.7% of a vinyl acetate copolymer as in Example 2,
  20% of the diazo compound used in Example 2,
  10.2% of Plexisol B 574 (see Example 1), 5.1% of polyvinyl methyl ether,
25.6% of Lutonal A 25 (see Example 1), and
1.3% of Crystal Violet.

A cover film is then applied as described in Example 1.

After pulling off the cover film, this colored resist layer is laminated onto a polyester film provided with a thin layer of white pigment and is exposed, either before or after pulling off the carrier film. To produce an image of the original on this carrier, it then merely remains necessary to develop the uniform smooth layer in an aqueous-alkaline medium and to dry it. Exposure, or exposure and developing, on the carrier film, and lamination of the exposed, or exposed and developed, layer is also possible.

EXAMPLE 6

The following 20μ thick positive dry resist layer, having a pressure-sensitive adhesive action, is applied onto a 25μ thick polypropylene film from ethylene glycol monoethyl ether:
41.7% of novolac,
16.7% of 1,2-naphthoquinone-2-diazide-5-sulphonic acid n-butylamine, and
41.7% of polyvinyl ethyl ether of high viscosity (Lutonal A 50).

This layer can be applied to numerous plane materials, for example paper, foil, metal, glass, ceramics, and even wood, by lamination or simple pressing-on with slight warming, and can then be cleanly separated from the carrier film. After exposure under a coarse original without making contact, for example at a distance of 1 mm, or after wiping over with a polyvinyl alcohol layer, allowing the latter to dry, and exposure in contact, with the thin polyvinyl alcohol layer preventing adhesion of the original, the image can be developed by wiping for 2 – 3 minutes with a 16% strength trisodium phosphate solution and can then be rinsed and dried. The image-wise layer portions, which have been transferred, possess relatively strong pressure-sensitive adhesion properties. Thus, writing and relatively coarse drawings, figures and screens can be fixed, by means of the dry resist layer, by powdering with any desired pigment dyestuffs, carbon black, luminescent powders and the like.

EXAMPLE 7

12μ thick yellow, blue and red positive resist layers of the following composition are each applied to a 100μ thick polyester film, which has been pre-treated as in Example 1, from ethylene glycol monomethyl ether:
30% of novolac,
7% of vinyl acetate copolymer as in Example 2,
20% of the diazo compound used in Example 2,
15% of Plexisol B 574 (see Example 1),
25% of Lutonal A 25 (see Example 1), and
3% of dyestuff.

Auramine D (C.I. 41,000) is used as the dyestuff for the yellow colored film, Victoria Pure Blue FGA (C.I. Basic Blue 81) is used for the blue film, and Grasol Fast Ruby 2 BL (C.I. Solvent Red 128) is used for the red film.

These colored films are provided with a covering film, and processed like the films of Example 1. However, it is also possible to laminate the layers, which have been exposed on the film, in accurate register onto one another before developing and, in doing so, in each case pulling off the covering film before lamination and the carrier film thereafter. Finally, all the superposed layers can then be carefully developed simultaneously with approximately 16% strength trisodium phosphate solution.

EXAMPLE 8

A 15μ thick photoresist layer of the following composition is applied to a 25μ thick polypropylene film from methyl ethyl ketone solution:
36.4% of novolac,
9.1% of vinyl acetate copolymer as in Example 2,
24.2% of the diazo compound used in Example 2,
12.1% of the copolymer indicated below and
18.2% of Plexisol B 574 (see Example 1).

The copolymer is produced by polymerizing 2 parts by weight of ethyl acrylate with 18 parts by weight of methacrylic acid in methyl ethyl ketone, in the presence of azodiisobutyronitrile, and has an acid number of 48.8. The covering film described in Example 1 is then applied.

To produce conductor plates, the covering film is pulled off and this resist is then slowly and repeatedly passed through the laminating system at about 135° C and is thus applied to a thin copper skin with sufficient adhesion. Thereafter, the carrier film is pulled off and the layer is exposed, without post-drying, under a positive original of a circuit diagram. After developing with 14% strength trisodium phosphate solution by spraying for approximately 3 minutes in a developing apparatus and etching with ferric chloride solution, a printed circuit is obtained.

EXAMPLE 9

A 20μ thick layer of the following composition is applied to a 36μ thick polyester film, which has been pre-treated as described in Example 1, from methyl ethyl ketone as the solvent:
35% of novolac,
8.8% of a vinyl acetate copolymer as in Example 2,
23% of the diazo compound used in Example 2,
11.8% of the copolymer described in Example 8,
17.6% of Plexisol B 547 (see Example 1),
3% of polyvinyl isobutyl ether of fairly high viscosity (Lutonal I 60) and
0.8% of Crystal Violet.

A covering film is laminated onto the dried layer, as described in Example 1.

This layer is applied at 135° C to both sides of an insulant carrier provided with a copper skin on both sides, both carrier films are then removed, the layers are post-dried, and the composite material is exposed from both sides, bored at the points recognizable after exposure, and then developed with the developer described in Example 3. To produce conductor plates, with through-contacts, it is subsequently possible to copper-plate the walls of the holes non-electrolytically, to thicken the copper by electroplating and to etch by one of the known processes.

EXAMPLE 10

A 20μ thick layer of the following composition is applied to a 25μ thick polypropylene film from ethylene glycol monoethyl ether:
30.8% of novolac,
7.7% of a vinyl acetate copolymer as in Example 2,
20.5% of the diazo compound used in Example 2,
15.4% of Plexisol B 574 (see Example 1),
25.0% of Lutonal A 25 (see Example 1 ) and 0.6% of Crystal Violet.

This layer is applied, in a laminator, to a cutout portion of 120-mesh polyester screen printing fabric at approximately 120° C, in the course of which about one-third of the layer penetrates into the fabric. Thereafter, the pre-sensitized fabric is transferred to a screen-printing frame, and fixed therein, by a clamping apparatus. After about 4 minutes' exposure with a 5 KW metal-halogen lamp under a negative original and through the carrier film, the latter is pulled off, the layer is wiped over with the developer indicated in Example 3 and the development is completed by spraying with water and drying. This screenprinting stencil is outstandingly suitable for printing with aqueous inks (textile printing) and solvent inks based on non-polar solvents, such as gasoline.

The application of the layer to the fabric can also be effected by wetting the surface of the layer or the fabric or both with ethylene glycol monoethyl ether and then laminating and drying, under light pressure.

It will be obvious to those skilled in the art that many modifications may be made within the scope of the present invention without departing from the spirit thereof, and the invention includes all such modifications.

What is claimed is:

1. A light-sensitive transfer composition comprising, as separate compounds in a homogeneous mixture,
    (a) about 25 to 40% by weight of an alkali-soluble novolak,
    (b) about 12 to 30% by weight of an o-naphthoquinone diazide sulfonic acid derivative selected from the group consisting of esters thereof and amides thereof, and
    (c) about 5 to 30% by weight of a polyalkyl acrylate or a polyalkyl methacrylate.

2. A composition as claimed in claim 1 wherein the light-sensitive material additionally contains from about 5 to about 35% by weight of a polyvinyl ether.

* * * * *